United States Patent
Treharne et al.

(10) Patent No.: US 10,148,209 B2
(45) Date of Patent: Dec. 4, 2018

(54) SYSTEM AND METHOD FOR IN-VEHICLE RESOLVER ALIGNMENT

(71) Applicant: FORD GLOBAL TECHNOLOGIES, LLC, Dearborn, MI (US)

(72) Inventors: William David Treharne, Ypsilanti, MI (US); Jonathan Andrew Butcher, Farmington, MI (US); Xuemei Sun, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/446,449

(22) Filed: Mar. 1, 2017

(65) Prior Publication Data

US 2018/0251119 A1 Sep. 6, 2018

(51) Int. Cl.
| | |
|---|---|
| *H02P 21/18* | (2016.01) |
| *B60W 20/19* | (2016.01) |
| *F02D 11/02* | (2006.01) |
| *B60W 10/08* | (2006.01) |
| *G05B 11/32* | (2006.01) |
| *H02P 21/20* | (2016.01) |
| *G05B 11/01* | (2006.01) |
| *G05B 11/42* | (2006.01) |
| *H02P 6/16* | (2016.01) |
| *H02P 6/06* | (2006.01) |
| *H02P 6/28* | (2016.01) |
| *H02P 6/08* | (2016.01) |

(52) U.S. Cl.
CPC ............ *H02P 21/18* (2016.02); *B60W 10/08* (2013.01); *B60W 20/19* (2016.01); *F02D 11/02* (2013.01); *G05B 11/011* (2013.01); *G05B 11/32* (2013.01); *G05B 11/42* (2013.01); *H02P 6/06* (2013.01); *H02P 6/08* (2013.01); *H02P 6/16* (2013.01); *H02P 6/28* (2016.02); *H02P 21/20* (2016.02); *B60W 2540/10* (2013.01); *Y10S 903/93* (2013.01)

(58) Field of Classification Search
CPC .. B60W 20/19; B60W 10/08; B60W 2540/10; H02P 6/28; H02P 6/08; H02P 6/06; H02P 6/16; H02P 21/20; H02P 21/18; G05B 11/011; G05B 11/32; G05B 11/42; F02D 11/02; Y10S 903/93
See application file for complete search history.

(56) References Cited

U.S. PATENT DOCUMENTS

| | | | |
|---|---|---|---|
| 8,638,052 B2 * | 1/2014 | Hohn et al. | H02P 21/36 318/400.09 |
| 9,007,010 B2 | 4/2015 | Kwon et al. | |
| 9,114,724 B2 * | 8/2015 | Chung et al. | H02P 21/50 |
| 9,484,851 B2 * | 11/2016 | Bang et al. | H02P 21/14 |

(Continued)

*Primary Examiner* — Dale W Hilgendorf
(74) *Attorney, Agent, or Firm* — David Kelley; Brooks Kushman P.C.

(57) ABSTRACT

A method, implemented in one or more controllers in a vehicle, includes, in a presence of a propulsive demand of the vehicle that is driven by an engine and an electric machine, holding electric machine current at a predetermined magnitude and sweeping an angle, defined between a reference current and a reference Iq component, through a predetermined range. The method further includes operating the electric machine thereafter according to a resolver offset derived from a value of the angle corresponding to an Iq component crossing zero.

20 Claims, 5 Drawing Sheets

(56) References Cited

U.S. PATENT DOCUMENTS

| | | |
|---|---|---|
| 2008/0272731 A1 | 11/2008 | Schulz et al. |
| 2009/0066281 A1* | 3/2009 | West et al. ............ H02P 29/032 318/434 |
| 2013/0275069 A1 | 10/2013 | Bang et al. |
| 2017/0170757 A1* | 6/2017 | Park et al. ................ H02P 6/16 |

* cited by examiner

SYSTEM AND METHOD FOR IN-VEHICLE RESOLVER ALIGNMENT

TECHNICAL FIELD

This application generally relates to calibrating a speed measurement device coupled to an electric machine in a vehicle.

BACKGROUND

Electrified vehicles include an electric machine that is controlled by an inverter. The electric machine includes a rotor coupled to a shaft. The shaft is coupled to a drivetrain to provide torque to the drivetrain or receive torque from the drivetrain. The inverter controls the rotational speed of the electric machine by implementing a control strategy. The control strategy may control a current waveform to the electric machine based on a rotor position. To effectively implement the control strategy, accurate knowledge of the rotor position is needed. The rotor position is measured by a sensor coupled to the rotor shaft.

SUMMARY

A method includes, in a presence of a propulsive demand from a vehicle driven by an engine and an electric machine, holding electric machine current at a predetermined magnitude, and sweeping an angle, defined between a reference current and a reference Iq component, through a predetermined range. The method further includes operating the electric machine thereafter according to a resolver offset derived from a value of the angle corresponding to an Iq component crossing zero.

The method may further include operating the engine and the electric machine to satisfy the propulsive demand by operating the engine at an engine power output to satisfy a difference between the propulsive demand and an output power of the electric machine when the electric machine current is at the predetermined magnitude. The method may further include holding the electric machine current at the predetermined magnitude for a predetermined duration by adjusting an output power of the engine to satisfy any changes in the propulsive demand during the predetermined duration. The propulsive demand may be defined by a driver demand that is input from an accelerator pedal. The method may further include operating an electrical load in the vehicle to maintain the electric machine current at the predetermined magnitude. The propulsive demand may be associated with a predetermined vehicle acceleration. The propulsive demand may be associated with a predetermined vehicle speed. The predetermined range may be between 80 degrees and 100 degrees. The resolver offset may be the value corresponding to the Iq component crossing zero minus ninety degrees. The method may further include limiting acceleration of the vehicle to a driver demanded acceleration. The method may further include, prior to the propulsive demand, charging a traction battery, that is electrically coupled to the electric machine, to a predetermined state of charge that permits operation of the electric machine at an electric machine current of the predetermined magnitude for a predetermined duration.

A vehicle, driven by an engine and an electric machine, includes a controller programmed to, in response to a propulsive demand exceeding a threshold during a resolver tuning request, hold a current of the electric machine at a predetermined magnitude, sweep an angle associated with the current through a predetermined range, and operate the electric machine thereafter according to a resolver offset derived from the angle that corresponds to an Iq component crossing zero.

The angle may be between a reference current and a reference Iq component. The controller may be further programmed to hold the current at the predetermined magnitude for a predetermined duration by adjusting an output power of the engine to satisfy any changes in the propulsive demand during the predetermined duration. The controller may be further programmed to operate the engine and the electric machine to achieve the propulsive demand by operating the engine at an engine power output to satisfy a difference between the propulsive demand and an output power of the electric machine when the current is at the predetermined magnitude.

A method includes accelerating a vehicle driven by an engine and an electric machine at a predetermined acceleration. The method further includes holding an electric machine current, defined by a magnitude and an angle between a reference current and a reference Iq component, at a predetermined magnitude. The method further includes sweeping the angle through a predetermined range. The method further includes operating the electric machine thereafter according to a resolver offset derived from the angle that corresponds to an Iq component crossing zero.

The method may further include holding the electric machine current at the predetermined magnitude for a predetermined duration. The method may further include releasing the electric machine current in response to decelerating the vehicle. The method may further include operating the engine and the electric machine to accelerate the vehicle by operating the engine at an engine power output to satisfy a difference between a demanded propulsive power and an output power of the electric machine when the electric machine current is at the predetermined magnitude. The method may further include accelerating the vehicle to a predetermined vehicle speed and maintaining speed of the vehicle to the predetermined vehicle speed for a predetermined time.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
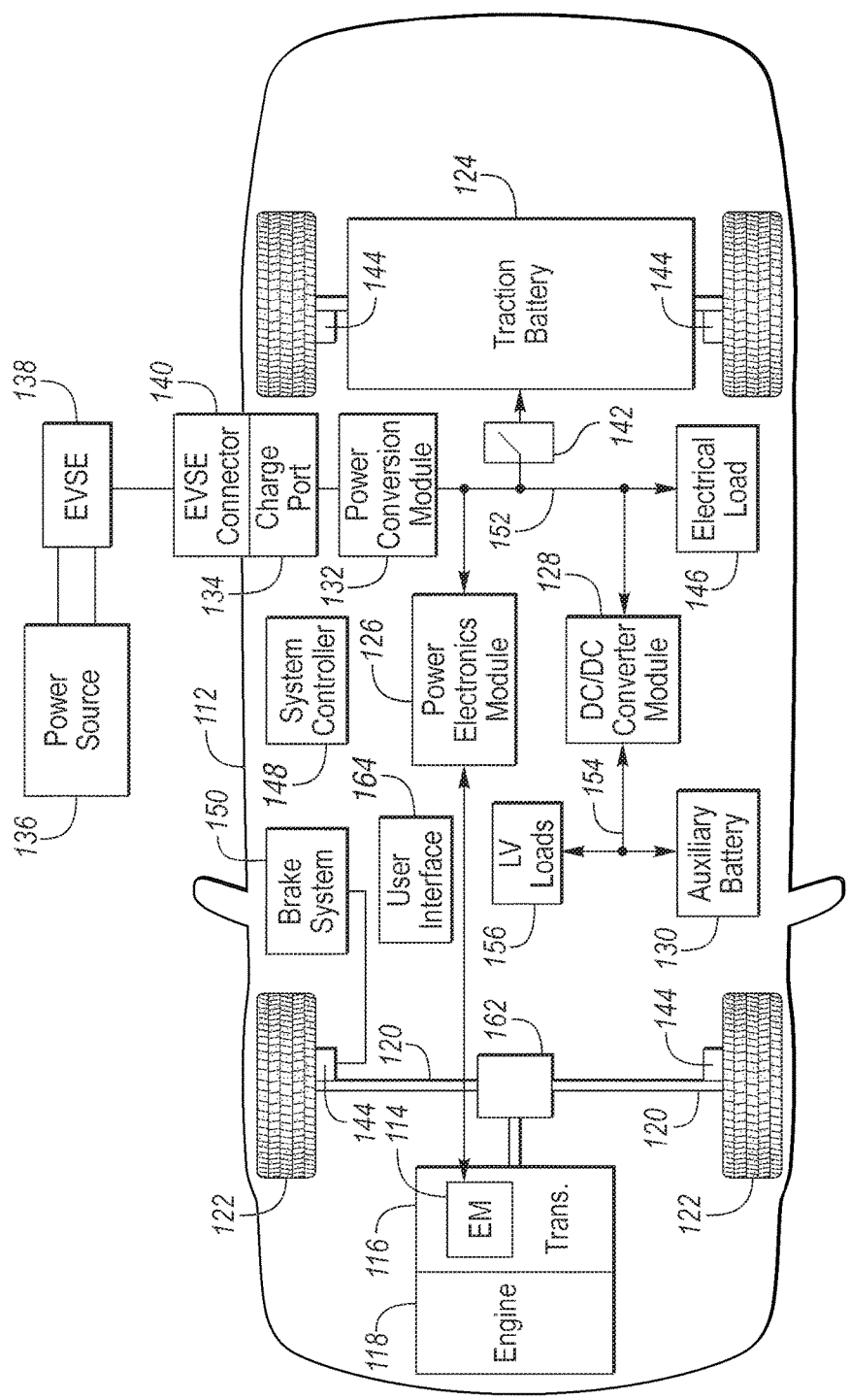
FIG. 1 depicts a possible configuration for an electrified vehicle.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 may be mechanically to a differential 162 that is configured to adjust the speed of drive shafts 120 that are mechanically coupled to drive wheels 122 of the vehicle 112. The drive shafts 120 may be referred to as the drive axle. In some configurations, a clutch may be disposed between the hybrid transmission 116 and the differential 162. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A battery pack or traction battery 124 stores energy that can be used by the electric machines 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be located in the traction battery 124. One or more power electronics modules 126 may be electrically coupled to the high-voltage bus 152. The power electronics modules 126 are also electrically coupled to the electric machines 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when appropriate. Examples of high-voltage electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger 132. The charger 132 may condition the power supplied from the EVSE 138 to provide the proper voltage and current levels to the traction battery 124 and the high-voltage bus 152. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components. Note that operations and procedures that are described herein may be implemented in one or more controllers. Implementation of features that may be described as being implemented by a particular controller is not necessarily limited to implementation by that particular controller. Functions may be distributed among multiple controllers communicating via the vehicle network.

The vehicle 112 may include a user interface 164 for interfacing with the operator. The user interface 164 may include display elements, such as lamps or a liquid-crystal display (LCD) module. The display elements may include a touch screen. The user interface 164 may further include input devices, such as switches, buttons, or touch-screen inputs. The user interface 164 may further include a diagnostic port that interfaces with an external diagnostic module. The diagnostic port may include conductors that are coupled to the vehicle network. The diagnostic port may permit the external diagnostic module to interface with controller in the vehicle 112. The external diagnostic module may be configured to send commands to the controllers. For example, various test modes may be entered by commands from the diagnostic module. Controllers in the vehicle may transmit message data to the diagnostic module. The message data may include responses to diagnostic requests as well as status information.

An operator of the vehicle may provide a demand for propulsive power by actuating an accelerator pedal. The propulsive power may be an amount of power that is supplied to the drive shafts 120 to propel the vehicle. Depressing the accelerator pedal may cause an increase in propulsive power that is demanded from the hybrid powertrain. Releasing the accelerator may cause a decrease in the propulsive power demanded. The hybrid powertrain may be configured to respond to the accelerator pedal input by changing the propulsive power supplied to the drive wheels.

In configurations that include a clutch, the clutch may be electrically activated and controlled. Clutch control signals may be interfaced to a powertrain controller. Other modules may request an open clutch or closed clutch via the vehicle network. When the clutch is opened, no torque is transferred from the electric machines 114 and the engine 118 to the drive axle 120. When the clutch is closed, torque is transferred from the engine 118 and the electric machines 114 to the drive axle 120. The clutch may selectively isolate the torque-producing components from the drive axle 120.

The hybrid powertrain 116 may be a power split configuration. The power split configuration may include a first electric machine that is configured to operate primarily as a generator. The power split configuration may include a second electric machine that is configured to provide propulsive power to the drive wheels. The engine 118 may be operated to drive the generator and provide propulsive power to the drive shafts 120. During a demand for propulsive power, the engine, generator and motor may be operated to achieve the demand. Power may be apportioned between the engine, the generator, and the motor to achieve the demand. Note that power to operate the electric machines may be supplied by the traction battery 124. Available power for the motor may be affected by charge and discharge limits of the traction battery 124. Various modes of operation are possible. For example, the engine 118 may drive the generator to supply power to the traction battery 124, the motor, and/or other electrical loads.

The electric machines 114 may be a permanent magnet synchronous motor (PMSM) type machine. A PMSM electric machine includes a rotor and a stator. The stator may include windings for producing a magnetic field to rotate the rotor. Current through the stator windings may be controlled to vary the magnetic field acting on the rotor. The rotor of a PMSM includes permanent magnets that create a magnetic field that interacts with the stator magnetic field to cause rotation of the rotor. The rotor speed may be controlled by the frequency of the magnetic field created by the stator.

The electric machines 114 may be comprised of a stator that includes stator windings and a rotor. The rotor may rotate about a central axis relative to the stator. The electric machines 114 may be controlled by flowing a generally sinusoidal current through stator windings. The amplitude and frequency of the current may be varied to control the torque and speed of the rotor. The stator current creates an electromagnetic field that interacts with the permanent magnets that are part of the rotor. This electromagnetic field causes the rotor to rotate. The electric machines 114 may be configured as three-phase machines. That is, the stator windings may include three separate phase windings. To control the electric machines 114, a three-phase voltage or current waveform is applied to the phase windings. The three-phase waveform is such that each phase signal is separated by a phase difference of 120 degrees.

Figure 2:
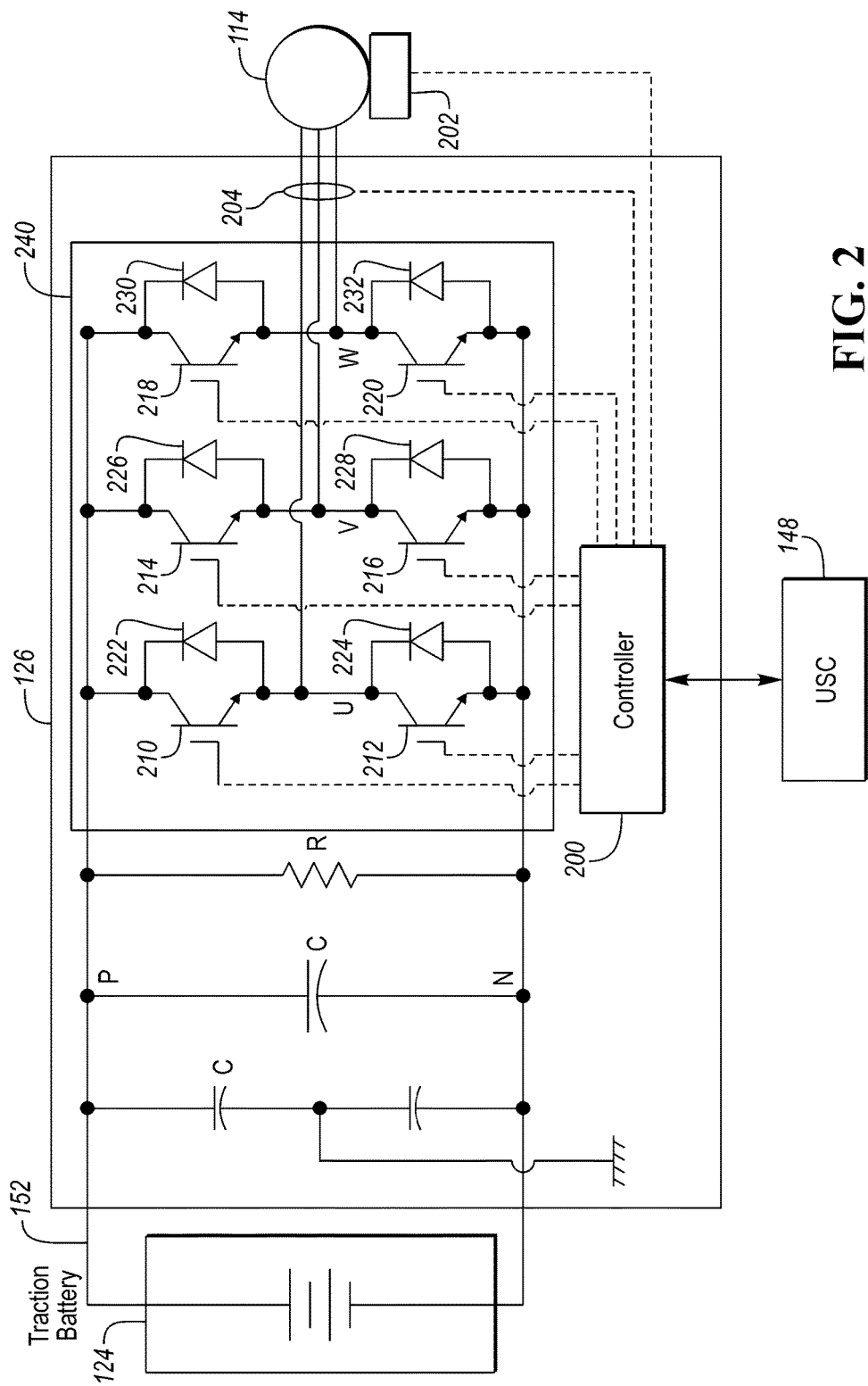
FIG. 2. depicts a possible configuration for a vehicle system including power electronics associated with an electric machine.

The electric machines 114 may be coupled to the power electronics module 126 via one or more conductors that are associated with each of the phase windings. FIG. 2 depicts a block diagram of a vehicle system that includes a motor control system. The vehicle 112 may include one or more power electronics controllers 200 configured to monitor and control the power electronics module 126. The conductors may be part of a wiring harness between the electric machine 114 and the power electronics module 126. A three-phase electric machine 114 may have three conductors coupled to the power electronics module 126. The power electronics module 126 may be configured to switch positive and negative terminals of the high-voltage bus 152 to phase terminals of the electric machines 114.

The power electronics module 126 may be controlled to provide sinusoidal voltage and current signals to the electric machine 114. The frequency of the signals may be proportional to the rotational speed of the electric machine 114.

The controller 200 may be configured to adjust the voltage and current output of the power electronics module 126 at a predetermined switching frequency. The switching frequency may be the rate at which the states of switching devices within the power electronics module 126 are changed. The frequency of the injection voltage may be selected as a predetermined multiple of the switching frequency.

The power electronics module 126 may interface with a position/speed feedback device 202 that is coupled to the rotor of the electric machine 114. For example, the position/speed feedback device 202 may be a resolver or an encoder.

The position/speed feedback device 202 may provide signals indicative of a position and/or speed of the rotor of the electric machine 114. The power electronics 126 may include a power electronics controller 200 that interfaces to the speed feedback device 202 and processes signals from the speed feedback device 202. The power electronics controller 200 may be programmed to utilize the speed and position feedback to control operation of the electric machine 114.

The power electronics 126 may include power switching circuitry 240 that includes a plurality of switching devices 210, 212, 214, 216, 218, 220. The switching devices may be Insulated Gate Bipolar Junction Transistors (IGBTs) or other solid-state switching devices. The switching devices may be configured to selectively couple a positive terminal and a negative terminal of the high-voltage bus 152 to each phase terminal or leg (e.g., labeled U, V, W) of the electric machine 114. Each of the switching devices within the power switching circuitry 240 may have an associated diode 222, 224, 226, 228 230, 232 connected in parallel to provide a path for inductive current when the switching device is in a non-conducting state. Each of the switching devices 210, 212, 214, 216, 218, 220 may have a control terminal for controlling operation of the associated switching device. The control terminals may be electrically coupled to the power electronics controller 200. The power electronics controller 200 may include associated circuitry to drive and monitor the control terminals. For example, the control terminals may be coupled to the gate input of the solid-state switching devices.

A first switching device 210 may selectively couple the HV-bus positive terminal to a first phase terminal (e.g., U) of the electric machine 114. A first diode 222 may be coupled in parallel to the first switching device 210. A second switching device 212 may selectively couple the HV-bus negative terminal to the first phase terminal (e.g., U) of the electric machine 114. A second diode 224 may be coupled in parallel to the second switching device 212. A third switching device 214 may selectively couple the HV-bus positive terminal to a second phase terminal (e.g., V) of the electric machine 114. A third diode 226 may be coupled in parallel to the third switching device 214. A fourth switching device 216 may selectively couple the HV-bus negative terminal to the second phase terminal (e.g., V) of the electric machine 114. A fourth diode 228 may be coupled in parallel to the fourth switching device 216. A fifth switching device 218 may selectively couple the HV-bus positive terminal to a third phase terminal (e.g., W) of the electric machine 114. A fifth diode 230 may be coupled in parallel to the fifth switching device 218. A sixth switching device 220 may selectively couple the HV-bus negative terminal to the third phase terminal (e.g., W) of the electric machine 114. A sixth diode 232 may be coupled in parallel to the sixth switching device 220.

The power electronics controller 200 may be programmed to operate the switching devices 210, 212, 214, 216, 218, 220 to control the voltage and current applied to the phase windings of the electric machine 114. The power electronics controller 200 may operate the switching devices 210, 212, 214, 216, 218, 220 so that each phase terminal is coupled to only one of the HV-bus positive terminal or the HV-bus negative terminal at a particular time.

Various motor control algorithms and strategies are available to be implemented in the power electronics controller 200. The power electronics module 126 may also include current sensors 204. The current sensors 204 may be inductive or Hall-effect devices configured to generate a signal indicative of the current passing through the associated circuit. In some configurations, two current sensors 204 may be utilized and the third phase current may be calculated from the two measured currents. The controller 200 associated may sample the current sensors 204 at a predetermined sampling rate. Measurement values for the phase currents of the electric machine 114 may be stored in controller memory for later computations.

The power electronics module 126 may include one or more voltage sensors. The voltage sensors may be configured to measure an input voltage to the power electronics module 126 and/or one or more of the output voltages of the power electronics module 126. The voltage sensors may be resistive networks and include isolation elements to separate high-voltage levels from the low-voltage system. In addition, the power electronics module 126 may include associated circuitry for scaling and filtering the signals from the current sensors 204 and the voltage sensors.

Under normal operating conditions, the power electronics controller 200 controls operation of the electric machine 114. For example, in response to torque and/or speed setpoints, the power electronics controller 200 may operate the switching devices 210, 212, 214, 216, 218, 220 to control the torque and speed of the electric machine 114 to achieve the setpoints. The torque and/or speed setpoints may be processed to generate a desired switching pattern for the switching devices 210, 212, 214, 216, 218, 220. The control terminals of the switching devices 210, 212, 214, 216, 218, 220 may be driven with Pulse Width Modulated (PWM) signals to control the torque and speed of the electric machine 114. The power electronics controller 200 may implement various well-known control strategies to control the electric machine 114 using the switching devices such as vector control and/or six-step control. During normal operating conditions, the switching devices 210, 212, 214, 216, 218, 220 are actively controlled to achieve a desired current through each phase of the electric machine 114.

Figure 3:
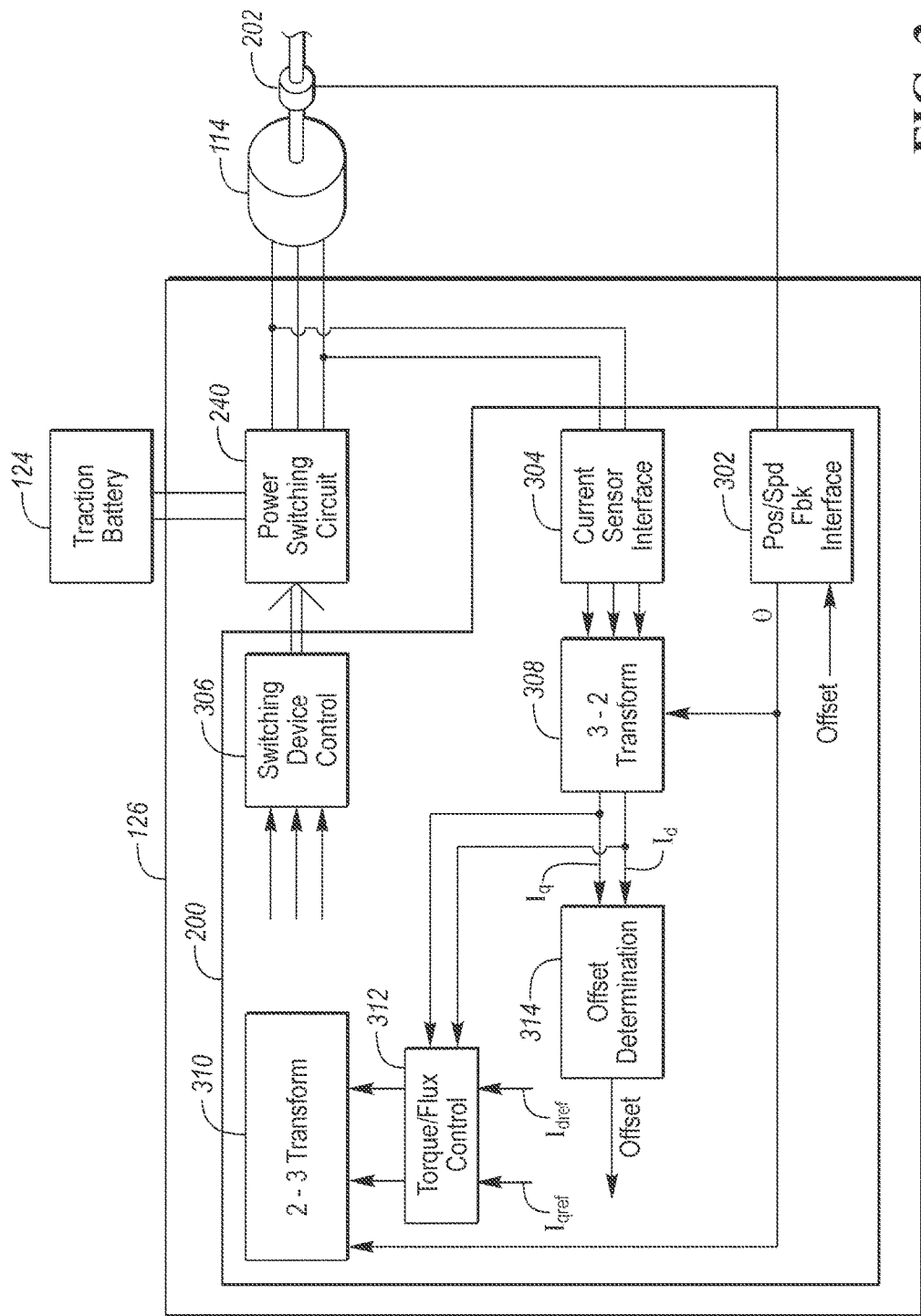
FIG. 3 depicts a possible block diagram for control logic in a controller for an electric machine.

FIG. 3 depicts a block diagram of control logic that may be implemented in the power electronics controller 200. The power electronics module 126 may be configured to provide a voltage to the electric machine 114 that results in a current flowing through the electric machine 114. The controller 200 may implement a field-oriented control scheme to control the electric machine 114. Field-oriented control of electric machines 114 is well-known in the art so only limited aspects may be described herein.

The power electronics controller 200 may include a position/speed feedback interface 302. The position/speed feedback interface 302 may include hardware and software that is configured to process signals from the position/speed feedback device 202. For example, when the position/speed feedback device 202 is a resolver, the interface may include an integrated circuit that processes the resolver signals to generate a digital angular position value. The position/speed feedback interface 302 may output an angular position value of the rotor. An angular speed of the rotor may be derived from a derivative of the angular position value with respect to time. In some configurations, the position/speed feedback interface 302 may output an angular speed of the rotor. The position/speed feedback interface 302 may include scaling of the signals to account for the number of electric machine poles and the number of resolver poles. The resolver may include two sets of windings. A first set of windings may return a signal that is the sine of the rotational angle and a second set of windings may return a signal that is the cosine of the rotation angle of the resolver shaft. The resolver angle may be computed as the arc-tangent of the sine of the angle divided by the cosine of the angle.

Field-oriented electric machine control may define an alternate coordinate system for controlling voltages and currents of the electric machine 114. The coordinate system selected allows for simpler control logic than the three-phase coordinate system of the electric machine 114. The selected coordinate system may transform the three-phase alternating voltage and currents into a coordinate system in which the voltages and currents are represented by DC voltages and currents. The transformation to DC values allows for more effective controls to be implemented.

The three phase values may be transformed into a two-axis coordinate system using one or more coordinate transformations. The three phase values may be measured or calculated values (e.g., voltages and/or currents). For example, in field-oriented electric machine control, coordinate transformations, such as the Park and Clarke coordinate transformations, are well known. The output of one coordinate transformation may be a vector in a stationary two-axis reference frame. One possible transformation from the three-phase quantities is the Clarke transformation which may be expressed as $$\begin{bmatrix} X_\alpha \\ X_\beta \end{bmatrix} = \begin{bmatrix} \frac{2}{3} & \frac{-1}{3} & \frac{-1}{3} \\ 0 & \frac{1}{\sqrt{3}} & \frac{-1}{\sqrt{3}} \end{bmatrix} \begin{bmatrix} X_U \\ X_V \\ X_W \end{bmatrix} \quad (1)$$

where $X_U$, $X_V$, and $X_W$ are the three-phase values which may represent a current (I) or voltage (V). Note that the three-phase values may differ by a phase angle. For example, $X_U$ may be a sinusoidal signal, $X_V$ may be shifted by 120 degrees from $X_U$, and $X_W$ may be shifted by 240 degrees from $X_U$. One axis of the stationary frame may be aligned with the U-phase such that at an angle of zero, the stationary frame component and the $X_U$ value are equal.

The Clarke transformation converts a three-phase system into the stationary two-axis reference frame. For control purposes, it may be desired to perform calculations with respect to a two-axis reference frame that rotates with respect to the stationary frame. One possible transformation is the Park transformation which may be expressed as $$\begin{bmatrix} X_d \\ X_q \end{bmatrix} = \begin{bmatrix} \cos(\theta) & \sin(\theta) \\ -\sin(\theta) & \cos(\theta) \end{bmatrix} \begin{bmatrix} X_\alpha \\ X_\beta \end{bmatrix} \quad (2)$$

where θ is the angle of the rotating frame with respect to the stationary frame. The angle θ may be relative to the U-phase of the original three-phase waveform such that at an angle of zero, the q-axis is aligned with the U-phase. The rotating reference frame proves useful for motor control purposes as a rotating reference frame may be chosen in which the d-axis and q-axis values behave as DC values instead of alternating values. For example, a current vector having a d-component and a q-component may be utilized for controlling the current in the electric machine 114. The d-component may represent a flux component, and the q-component may represent a torque component. Adjusting the torque of the electric machine 114 is then achieved by adjusting the torque component.

The flux and torque of the electric machine 114 may be controlled by adjusting the d-component and the q-component of the voltage or current. A flux controller may be implemented to adjust the d-component. The flux controller may input an error between a reference flux current and the measured flux current (d-component). The flux controller may output a d-component voltage command that may achieve the reference flux current. A torque controller may be implemented to adjust the q-component. The torque controller may input an error between a reference torque current and the measured torque current (q-component). The torque controller may output a q-component voltage command that may achieve the reference torque current.

The advantage of the rotating reference frame is evident when considering a three-phase sinusoid having a constant amplitude and frequency. In the stationary two-axis reference frame, the $X_\alpha$ and $X_\beta$ components will vary at the frequency of the sinusoidal signal. The same signal may be represented in a rotating reference frame that rotates at the same constant frequency. In the rotating reference frame, the $X_d$ and $X_q$ components will appear to be constant values. Control operations may be performed on the rotating reference frame variables and then converted back to the equivalent three-phase values.

Quantities in the rotating reference frame may be returned to the stationary reference frame by the inverse of the Park transformation which may be expressed as $$\begin{bmatrix} X_\alpha \\ X_\beta \end{bmatrix} = \begin{bmatrix} \cos(\theta) & -\sin(\theta) \\ \sin(\theta) & \cos(\theta) \end{bmatrix} \begin{bmatrix} X_d \\ X_q \end{bmatrix} \quad (3)$$

A quantity in the stationary two-axis reference frame may be returned to the three-phase frame using the inverse of the Clarke transformation which may be expressed as $$\begin{bmatrix} X_U \\ X_V \\ X_W \end{bmatrix} = \begin{bmatrix} 1 & 0 \\ \frac{-1}{2} & \frac{\sqrt{3}}{2} \\ \frac{-1}{2} & \frac{-\sqrt{3}}{2} \end{bmatrix} \begin{bmatrix} X_\alpha \\ X_\beta \end{bmatrix} \quad (4)$$

The description above represents one possible coordinate transformation scheme. Other transformations are possible. In actual implementation, the transformation matrices may be combined to reduce the number of computations required.

FIG. 3 depicts a block diagram for a control system that may be implemented in a power electronics controller 200 that is part of the power electronics module 126. The control strategy may implement a torque/flux control function 312. The torque/flux control function 312 may output signals to achieve reference values for the d-axis and q-axis components. The torque/flux control function 312 may input a torque component reference, $I_{qref}$, and a flux component reference, $I_{dref}$. In addition, a measured torque component, $I_q$, and a measured flux component, $I_d$, may also be input to the torque/flux control function 312.

The d-axis and q-axis component values may be transferred to a 2-3 phase transform block 310. The 2-3 phase transform block 310 may convert the d-axis and q-axis components to a three-phase voltage or current waveform. For example, the 2-3 phase transform block 310 may implement equations (3) and (4). The 2-3 phase transform block 310 may input the resolver position.

The three-phase values may be transferred to a switching device control 306 function. The switching device control function 306 may process the three-phase values into a switching pattern for the switching devices of the power switching circuitry 240. For example, the switching device control function 306 may output six gate-drive signals. The switching device control function 306 may convert the three-phase values into pulse-width modulated gate drive signals.

The power switching circuitry 240 is electrically coupled to the traction battery 124. The power switching circuitry 240 may output three-phase signals to the electric machine 114 that cause the electric machine 114 to create torque. The angular position of the rotor of the electric machine 114 may be measured by the resolver 202. A position/speed feedback interface 302 may be implemented to convert signals from the resolver to an absolute position of the rotor. The rotor position from the position/speed feedback interface 302 may be input to the 2-3 phase transform block 310.

The power electronics controller 200 may include a current sensor interface 304 to convert signals from the current sensors to digital values for use by the control strategy. The three-phase currents that are measured and converted may be output to a 3-2 phase transform block 308. The rotor position from the position/speed feedback interface 302 may be input to the 3-2 phase transform block 308.

The 3-2 phase transform block 308 may convert the three-phase values to two-phase values in the rotating reference frame. That is, the three-phase currents may be converted to a torque component in the q-axis ($I_q$) and a flux component in the d-axis ($I_d$). For example, the 3-2 phase transform block may implement equations (1) and (2). The values of the current in the rotating reference frame may be sent to an offset determination function 314 for further processing. The output of the offset determination function 314 may be a resolver or position offset for proper alignment of the resolver 202 and electric machine 114.

As observed above, the transformations depend on the angle of the rotating frame with respect to the stationary frame. The angle can be obtained from the position feedback measurement device coupled to the shaft of the electric machines 114. For example, a resolver provides an absolute position value based on the angle of rotation of the resolver shaft. That is, at a given position, the resolver returns the same value each time the resolver is turned to the given position. In order to use the resolver values in the transformations, the relationship between the resolver value and the angle between the stationary and rotating reference frames should be identified. To operate effectively, the d-axis should be aligned with the permanent magnetic field of the rotor (e.g., rotor flux field). That is, the resolver position representing the rotor position when the d-axis and rotor flux field are aligned may need to be known.

During assembly, the resolver shaft may be coupled to the rotor shaft. A zero position of the resolver may be aligned with the expected rotor flux field of the rotor and the d-axis of the control field. For example, the rotor shaft may include a cutout that corresponds to the rotor flux field. The resolver shaft may include a notch configured to mate with the cutout in rotor shaft to provide an initial alignment between the resolver value and the rotor flux field. The desired alignment may be such that at an angle of zero, the motor U-phase is aligned with the center of the resolver sine winding. In addition, the resolver may be mounted in a fixed manner relative to the stator such that the rotor flux field is aligned with the d-axis. This may provide an initial estimate of the rotor flux field position and the d-axis. However, due to manufacturing and assembly tolerances, the alignment may not be precise. Due to this, the d-axis and the rotor flux field may not be precisely aligned and the resolver value for alignment may not be known precisely. A method of fine-tuning the alignment may be used to improve control. For example, a resolver value corresponding to an offset angle between the rotating frame and the stationary frame must be learned. This relationship may be expressed as a resolver offset. For example, an offset added to the resolver angle may yield the correct resolver value at which the rotor flux field and the d-axis of the rotating reference frame are aligned. Once identified, the resolver offset may be stored in non-volatile memory for continued use. The issue for control purposes is to identify this resolver offset value.

If the offset between the resolver position and the stationary frame is not known precisely, the torque control may be inaccurate. An alignment procedure may be performed to improve rotor angular position accuracy.

For a PMSM, the electric machine torque produced is given by:

$$\tau_e = \frac{3P}{2}[\lambda_m + (L_d - L_q)i_d]i_q \tag{5}$$

where P is the number of pole pairs of the PMSM, $\lambda_m$ is the magnetic flux linkage of the PMSM, $L_d$ and $L_q$ are the electric machines equivalent inductances along the d and q axes, $i_d$ and $i_q$ are the motor currents as expressed in the dq-coordinate frame. It is observed that the torque is zero when $i_q$ is equal to zero. In addition, when the phase angle is 90 degrees, the torque is also zero.

A reference current may be injected into the electric machine 114 in order to identify the resolver offset. A reference current may be defined as:

$$Iq_{ref} = I_{mag}*\cos(\varphi_{ref}) \tag{6}$$

$$Id_{ref} = I_{mag}*\sin(\varphi_{ref}) \tag{7}$$

where $I_{mag}$ represents a reference current vector in the rotating reference frame that is offset by an angle, $\varphi_{ref}$, from the q-axis. Equations (6) and (7) are the projections of the current vector on the q-axis and the d-axis. When the resolver 202 and electric machine 114 are properly aligned, the torque-component (e.g., $I_q$) should be zero when $\varphi_{ref}$ is ninety degrees. However, when proper alignment is not present, the torque-component may be zero at a different angle of $\varphi_{ref}$. This property may be utilized to determine a resolver offset. The reference current vector may be defined in the rotating reference frame with an $I_q$ component (value along the q-axis) and an $I_d$ component (value along the d-axis).

A control strategy may be implemented to apply a current of a predetermined magnitude over a range of angles, $\varphi_{ref}$. The torque-component currents ($I_q$) may be measured and stored during the sweep through the angle range. The angle sweep may be repeated for more than one predetermined magnitude. The torque-component currents may be analyzed to determine at which angle the torque-component crosses zero. The resolver offset may be based on the angle at which the torque-component crosses zero.

Figure 4:
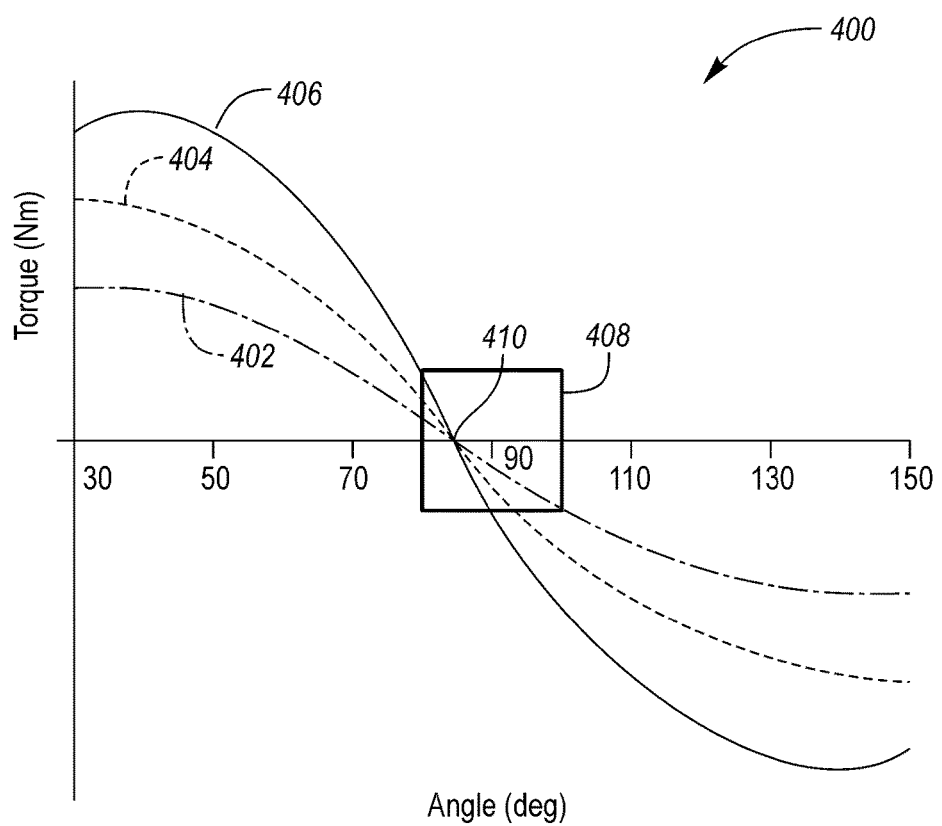
FIG. 4 depicts possible responses of electric machine torque to a sweep of a phase angle that characterizes the current.

FIG. 4 depicts a possible series of torque curves that may arise for different current magnitudes that are swept through a range of angles. For example, a first torque curve 402 may be obtained for a first predetermined current magnitude (e.g., 100 Amps). A second torque curve 404 may be obtained for a second predetermined current magnitude (e.g., 150 Amps).

A third torque curve 406 may be obtained for a third predetermined current magnitude (e.g., 200 Amps). Since the torque is a function of the $I_q$ component (value of current vector along the q-axis), the curves also represent the $I_q$ value over the range of angles. That is, the angle at which the $I_q$ component crosses zero is the same angle at the torque crosses zero.

In general, the first torque curve 402, the second torque curve 404, and the third torque curve 406 should intersect at zero at a zero-crossing angle 410. The zero-crossing angle 410 is the angle at which the torque curves (or corresponding $I_q$ curves) cross zero. An angle sweep region 408 may exist that is most likely to contain the zero-crossing angle 410. For example, the sweep region 408 may be those angles from 80 degrees to 100 degrees. When the resolver 202 and the electric machine 114 are in proper alignment, it would be expected that the zero-crossing angle 410 is 90 degrees.

The actual resolver offset is equal to the angle at the intersection point minus 90 degrees. The resolver offset may be stored in non-volatile memory. The resolver offset may be added to the resolver position during further operations. For example, the position/speed feedback interface 302 may automatically add the resolver offset to the resolver value to correct the alignment. In this manner, the proper angle is provided to the functions that depend on the angle.

The resolver offset determination may be implemented as a service routine. A diagnostic protocol may be defined for the vehicle 112. The diagnostic protocol may define the interactions between on-vehicle controllers and the external diagnostic module. The diagnostic protocol may include a message or command (e.g., a resolver tuning request) to initiate the resolver offset determination. When the resolver offset determination command is received, the vehicle control system may initiate the resolver offset determination. The vehicle control system may check that the vehicle is in a condition for initiating the resolver offset test. For example, in some configurations, the resolver offset determination may only be performed when the vehicle is at a standstill. Other conditions may include an absence of fault conditions. In other configurations, an operator may be prompted to perform one or more driving maneuvers when the resolver tuning request is active.

In some configuration, the electric machine 114 may be rotated at a predetermined speed to permit conditions for determining the resolver offset. In an assembly environment, rotation of the electric machine 114 may be achieved by a separate motor coupled to the electric machine shaft. In an assembled vehicle, this is not practical. In some configurations, rotation of the electric machine 114 may be achieved by operating the engine 118 at a predetermined engine speed. Before performing the control strategy described, the drive axle 122 may be isolated from the engine 118 and electric machine 114 during the tuning operation. In configurations having a clutch, isolating the drive axle 122 from the engine 118 and electric machine 114 may be achieved by opening the clutch. In some configurations, such as a power split hybrid transmission, in which the clutch is absent other procedures may be used to operate the electric machine 114 at an appropriate current level.

In order to determine the resolver offset, conditions for operating the electric machine 114 at the predetermined current magnitudes must be present. In some configurations, the predetermined current magnitudes may be obtained during vehicle operation. That is, propulsive power may be demanded to operate the powertrain such that the predetermined current magnitudes are achieved. For example, an operator may be prompted to perform a drive cycle including periods of acceleration, deceleration, and/or steady-state speed operation.

A resolver offset determination mode may be entered via a diagnostic command. The system may prompt the operator via the user interface 164. For example, when the resolver offset test mode is entered, a message may be displayed providing additional information to the operator. The prompt may request the operator to accelerate the vehicle to a predetermined speed. The prompt may include an indication that the acceleration is a desired amount and may include indicators requesting an increase or decrease in acceleration. The system may respond immediately to any driver demands for a decrease in acceleration.

In order to achieve the predetermined current magnitudes, the electric machine 114 may be operated under load conditions (e.g., during vehicle drive cycle). A propulsive power demand may be requested by the operator via the accelerator pedal. The propulsive power demand may be an amount of power and/or torque to be applied to the driven wheels. For example, the system controller 148 may be programmed to apportion the propulsive power demand between the engine 118 and the electric machine 114 to satisfy the propulsive demand. In the resolver offset tuning mode, the system controller 148 may be programmed to satisfy at least a portion of the propulsive demand using the electric machine 114 operating at a predetermined current magnitude. The remaining portion of the propulsive demand may be satisfied using power from the engine. The controller 148 may be programmed to account for efficiency and system losses when determining the operating points of the engine 118 and electric machine 114.

The system controller 148 may monitor when the propulsive demand exceeds a power level associated with the predetermined current magnitude. When the propulsive demand exceeds the power level associated with the predetermined current magnitude, the system controller 148 may hold the current of the electric machine 114 at the predetermined magnitude. Any changes to the propulsive demand during the hold period may be satisfied by changing the engine power. While the current is being held at the predetermined current magnitude, the angle associated with the current may be swept through the predetermined range.

Operating the engine 118 and the electric machine 114 to achieve demand for propulsive power may be achieved by operating the engine 118 at an engine power output to satisfy a difference between the demanded propulsive power and an output power of the electric machine 114 when the electric machine current is at the predetermined magnitude. In addition, while the electric machine current is being held at the predetermined magnitude, any change in the propulsive demand may be satisfied by changing the engine power output. In addition, other vehicle electrical loads may be operated to maintain the electric machine current at the predetermined magnitude. For example, electrical loads may be turned off during the test to ensure that the electrical system can support operation of the electric machine 114 at the predetermined current magnitude. During the test mode, the apportioning strategy may be modified in order to bias the powertrain to operate the electric machine 114 at the predetermined current magnitude. The acceleration of the vehicle may be limited to a driver demanded acceleration. That is, the system may be configured to ensure that the vehicle does not accelerate faster than demanded by the driver.

The demand for propulsive power may be associated with a predetermined vehicle acceleration and/or a predetermined vehicle speed. For example, modeling results may indicate that operating the electric machine 114 at a predetermined current magnitude may cause the vehicle to travel at a predetermined vehicle speed. The operator may be instructed via the user interface 164 to accelerate to the predetermined vehicle speed.

Prior to the demand for propulsive power, the system may charge the traction battery 124 to ensure that there is enough power available to operate the electric machine 114 at the predetermined current magnitude. For example, the engine 118 may drive a generator (e.g., another electric machine) to charge the traction battery 124. In addition, the engine 118 may drive the generator during the demand for propulsive power to supply addition power to the electric machine 114. The test procedure may include rest periods in which the traction battery 124 is charged before executing additional periods of propulsive demand.

In a system that includes a generator, additional tuning may be required for a resolver associated with the generator. In this case, the controller may initiate a procedure to discharge the traction battery 124 to ensure that the generator can be operated at a predetermined current magnitude for a predetermined time interval. In addition, electrical loads in the vehicle may be operated to draw power supplied by the generator operating at the predetermined current magnitude. The procedure may be performed during the demand for propulsive power by operating the electric machine to provide propulsion and the generator to provide power to the electric machine. In this manner, the tuning procedure for the generator is similar to the procedure for the electric machine that provides propulsion.

Figure 5:
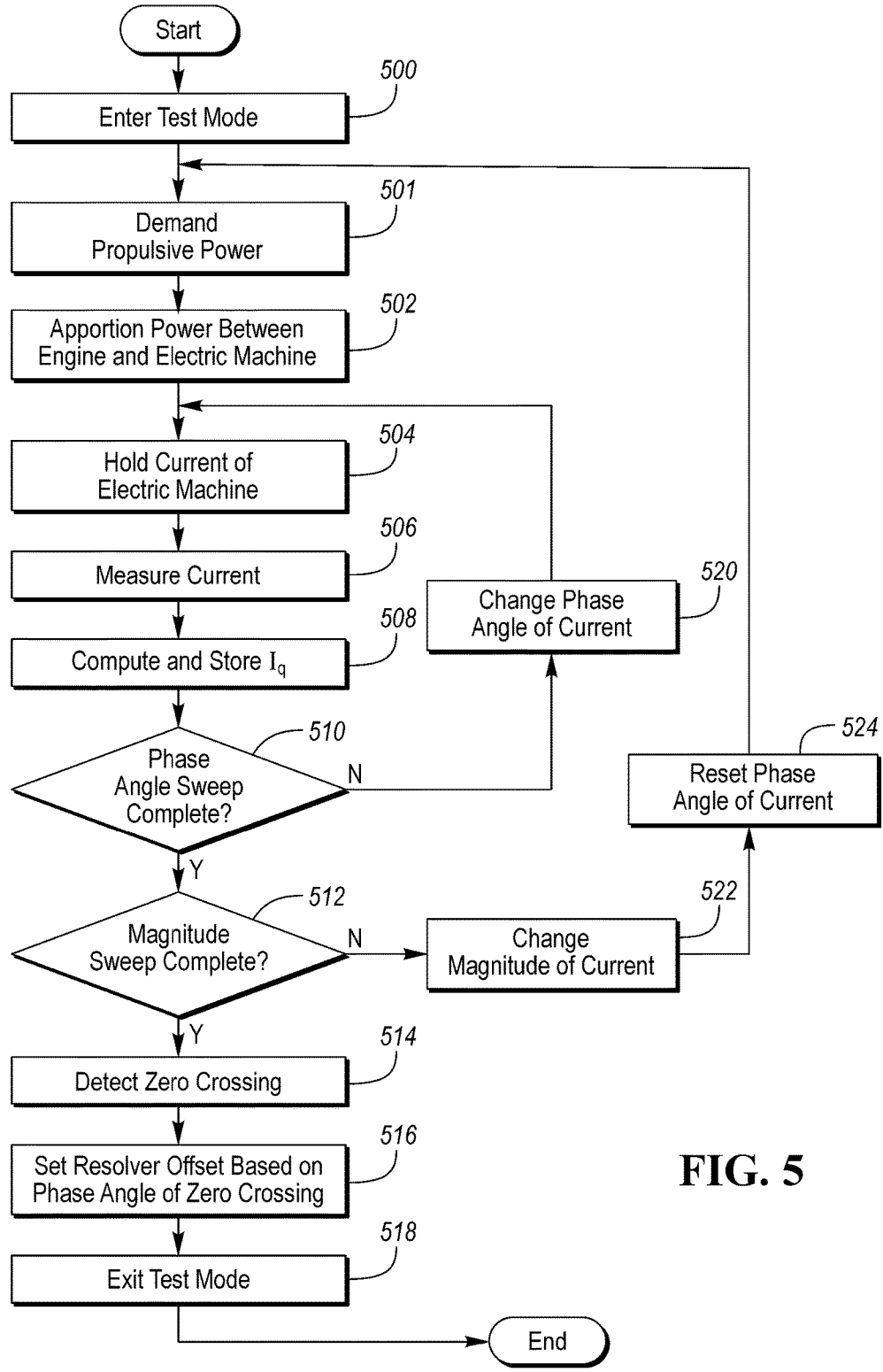
FIG. 5 is a flowchart for a possible sequence of operations for determining a resolver offset.

FIG. 5 depicts a flow chart for a possible sequence of operations for implementing the resolver offset determination in the power electronics controller 200 that may be part of a vehicle powertrain control system. At operation 500, the controller 200 may be programmed to enter the resolver tuning mode (e.g., test mode). Entering the test mode may be in response to receiving a diagnostic request to enter the resolver tuning mode. At this time, the controller 200 may cause information and instructions to be displayed to the operator related to the resolver tuning mode.

At operation 501, the controller 200 may monitor for a demand for propulsive power from the operator. The desired demand level may be indicated to the operator via the user interfaces 164. The controller 200 may monitor the demand to ensure that the demand is at a level exceeding an amount propulsive power caused by the electric machine 114 operating at the predetermined current magnitudes. At operation 502, the controller 200 may apportion power between the engine 118 and the electric machine 114 to satisfy the propulsive demand and operate the electric machine 114 at the predetermined current magnitude.

During the operation, additional conditions may be checked to determine if the test should be continued. For example, the engine and electric machine speeds may be checked to determine if the speeds are in a predetermined range about a predetermined speed. Various fault conditions may be checked to ensure that the procedure may be continued. For example, any fault conditions in the power electronics module 126 may prevent the procedure from completing. Additionally, signals and status related to the resolver 202 may be checked to ensure that resolver feedback is available. If the conditions are not satisfied, operation 518 may be performed to stop the engine.

At operation 504, the current of the electric machine 114 may be held at a predetermined current magnitude. The current may be defined in part by the angle between a reference current vector and a reference $I_q$ component. The current may be defined as in equations (6) and (7). The current may be characterized by a reference current vector defined by a magnitude and a phase angle between the current vector and the q-axis of the rotating reference frame. During the first pass through, the angle may be initialized to a starting value of the sweep. The current may be held at the predetermined magnitude for a predetermined duration. The predetermined duration may be an amount of time sufficient to sweep the phase angle through the desired range of angles. The reference current may be input to the torque/flux control 312 to cause the reference current to flow in the electric machine 114.

At operation 506, the three-phase currents are measured and converted to the rotating reference frame as described. For example, the measured torque component ($I_q$ component) of the current may be derived from the current sensor interface 304 and the 3-2 transform function 308 as described.

At operation 508, the torque-component of the current is computed and stored. The torque component ($I_q$) may be stored in memory along with the associated phase angle of the reference current vector. The $I_q$ may be measured over a number of sampling intervals to ensure the that value is stabilized. In some configurations, an average of the values measured may be stored to reduce measurement noise. Other filtering schemes may be utilized.

At operation 510, a check may be performed to determine if the phase angle sweep is complete. If the phase angle sweep is not completed, operation 520 may be performed to increase the phase angle. Operations 504 through 510 may then be repeated. The phase angle of the reference current vector may be swept over a predetermined range of angles. For example, the phase angle sweep may include reference current vector phase angles from 80 degrees to 100 degrees. The phase angle may be incremented by one degree for each iteration through the phase angle sweep.

If the phase angle sweep is completed, operation 512 may be performed. At operation 512, a check is performed to determine if the magnitude sweep is complete. If the magnitude sweep is not complete, operation 522 may be performed to change the predetermined current magnitude. Operation 524 may then be performed to reset the phase angle for the next sweep. Operations 501 through 512 may then be repeated at the updated predetermined current magnitude. The reference current magnitude may be swept over a predetermined range of magnitudes. For example, the magnitude sweep may be performed for three different current vector magnitudes, 100 Amp, 150 Amps and 200 Amps. When the predetermined current magnitude changes, the propulsive power demand may need to change as well as the apportioning of the propulsive power.

If the magnitude sweep is complete, operation 514 may be performed. At operation 514, the zero crossings for each of the torque-component ($I_q$) curves for each of the magnitude/phase sweeps is computed. For each of the magnitude/phase sweeps, the phase angle at which the torque-component crosses zero may be found by searching through the stored data. Due to measurement noise, the zero crossing may not be the same for each of the magnitude/phase sweeps. An average of all of the zero crossings may be computed.

In some configurations, the zero crossing may be determined in real time without storing the currents and angles for later processing. For example, the $I_q$ component may be monitored during the phase angle sweep. The controller may be programmed to identify the angle at which the $I_q$ component changes sign (e.g., positive to negative or negative to positive) or becomes zero. The phase angle sweep may then be repeated for the next magnitude. The angle may be stored for later processing and comparison to the angles from each magnitude sweep.

At operation 516, the resolver offset may be set based on the phase angle at the zero crossing. The resolver offset may be set as the phase angle at the zero crossing minus 90 degrees. The resolver offset may be an average angle at which the torque-component crosses zero, in which the average includes the zero-crossing angle corresponding to each of the magnitudes. The resolver offset may be stored and used by the motor control strategy during electric machine operation. The resolver offset may be added to the present resolver value to provide a compensated position value for control purposes.

At operation 518, the test mode may be exited and the electric machine 114 may be operated thereafter using the resolver offset value. With the fine-tuned resolver offset value, torque control may be more accurate. More consistent vehicle powertrain control is achieved by knowing the resolver offset. Operating the electric machine 114 includes controlling the current and/or torque of the electric machine 114 using the resolver position adjusted by the resolver offset value. For example, the current is controlled utilizing the transformations described that depend on an accurate resolver position for best results.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method comprising:
   in a presence of a propulsive demand from a vehicle driven by an engine and an electric machine,
      holding electric machine current at a predetermined magnitude, and
      sweeping an angle, defined between a reference current and a reference torque-component current, through a predetermined range; and
   operating the electric machine thereafter according to a resolver offset derived from a value of the angle corresponding to a torque-component current crossing zero.

2. The method of claim 1 further comprising operating the engine and the electric machine to satisfy the propulsive demand by operating the engine at an engine power output to satisfy a difference between the propulsive demand and an output power of the electric machine when the electric machine current is at the predetermined magnitude.

3. The method of claim 1 further comprising holding the electric machine current at the predetermined magnitude for a predetermined duration by adjusting an output power of the engine to satisfy any changes in the propulsive demand during the predetermined duration.

4. The method of claim 1 wherein the propulsive demand is defined by a driver demand that is input from an accelerator pedal.

5. The method of claim 1 further comprising operating an electrical load in the vehicle to maintain the electric machine current at the predetermined magnitude.

6. The method of claim 1 wherein the propulsive demand is associated with a predetermined vehicle acceleration.

7. The method of claim 1 wherein the propulsive demand is associated with a predetermined vehicle speed.

8. The method of claim 1 wherein the predetermined range is between 80 degrees and 100 degrees.

9. The method of claim 1 wherein the resolver offset is the value corresponding to the torque-component current crossing zero minus ninety degrees.

10. The method of claim 1 further comprising limiting acceleration of the vehicle to a driver demanded acceleration.

11. The method of claim 1 further comprising, prior to the propulsive demand, charging a traction battery, that is electrically coupled to the electric machine, to a predetermined state of charge that permits operation of the electric machine at an electric machine current of the predetermined magnitude for a predetermined duration.

12. A vehicle, driven by an engine and an electric machine, comprising:
   a controller programmed to, in response to a propulsive demand exceeding a threshold during a resolver tuning request, hold a current of the electric machine at a predetermined magnitude, sweep an angle associated with the current through a predetermined range, and operate the electric machine thereafter according to a resolver offset derived from the angle that corresponds to a torque-component current crossing zero.

13. The vehicle of claim 12 wherein the angle is between a reference current and a reference torque-component current.

14. The vehicle of claim 12 wherein the controller is further programmed to hold the current at the predetermined magnitude for a predetermined duration by adjusting an output power of the engine to satisfy any changes in the propulsive demand during the predetermined duration.

15. The vehicle of claim 12 wherein the controller is further programmed to operate the engine and the electric machine to achieve the propulsive demand by operating the engine at an engine power output to satisfy a difference between the propulsive demand and an output power of the electric machine when the current is at the predetermined magnitude.

16. A method comprising:
- accelerating a vehicle driven by an engine and an electric machine at a predetermined acceleration;
- holding an electric machine current, defined by a magnitude and an angle between a reference current and a reference torque-component current, at a predetermined magnitude;
- sweeping the angle through a predetermined range; and
- operating the electric machine thereafter according to a resolver offset derived from the angle that corresponds to a torque-component current crossing zero.

17. The method of claim 16 further comprising holding the electric machine current at the predetermined magnitude for a predetermined duration.

18. The method of claim 16 further comprising releasing the electric machine current in response to decelerating the vehicle.

19. The method of claim 16 comprising operating the engine and the electric machine to accelerate the vehicle by operating the engine at an engine power output to satisfy a difference between a demanded propulsive power and an output power of the electric machine when the electric machine current is at the predetermined magnitude.

20. The method of claim 16 further comprising accelerating the vehicle to a predetermined vehicle speed and maintaining speed of the vehicle to the predetermined vehicle speed for a predetermined time.

* * * * *